US008652588B2

(12) United States Patent
Teer et al.

(10) Patent No.: US 8,652,588 B2
(45) Date of Patent: Feb. 18, 2014

(54) METHOD OF COATING A SURFACE OF AN ARTICLE AGAINST AQUATIC BIO FOULING

(75) Inventors: Dennis Teer, Droitwich (GB); Laurent Akesso, Droitwich (GB); Parnia Navabpour, Droitwich (GB)

(73) Assignee: Teer Coatings Limited, Worcestershire (GB)

( * ) Notice: Subject to any disclaimer, the term of this patent is extended or adjusted under 35 U.S.C. 154(b) by 285 days.

(21) Appl. No.: 12/733,483

(22) PCT Filed: Sep. 15, 2008

(86) PCT No.: PCT/GB2008/003123
§ 371 (c)(1),
(2), (4) Date: Jun. 4, 2010

(87) PCT Pub. No.: WO2009/034359
PCT Pub. Date: Mar. 19, 2009

(65) Prior Publication Data
US 2010/0247928 A1 Sep. 30, 2010

(30) Foreign Application Priority Data
Sep. 14, 2007 (GB) .................................. 0717921.1

(51) Int. Cl.
C23C 14/35 (2006.01)
C23C 14/34 (2006.01)
B05D 5/08 (2006.01)
C23C 14/00 (2006.01)
C23C 16/40 (2006.01)
C23C 16/50 (2006.01)
F28F 19/02 (2006.01)
C03C 17/30 (2006.01)
C03C 17/34 (2006.01)
C03C 25/22 (2006.01)
C03C 25/48 (2006.01)

(52) U.S. Cl.
CPC ............... *C23C 14/35* (2013.01); *C23C 14/345* (2013.01); *B05D 5/08* (2013.01); *C23C 14/0057* (2013.01); *C23C 16/401* (2013.01); *C23C 16/50* (2013.01); *F28F 19/02* (2013.01); *C03C 17/30* (2013.01); *C03C 17/3435* (2013.01); *C03C 17/3482* (2013.01); *C03C 25/226* (2013.01); *C03C 25/48* (2013.01)
USPC ...... 427/579; 427/578; 427/255.7; 427/419.3

(58) Field of Classification Search
USPC ......................................... 427/569, 574, 578
See application file for complete search history.

(56) References Cited

U.S. PATENT DOCUMENTS 5,137,701 A * 8/1992 Mundt .......................... 423/210
6,383,642 B1   5/2002 La Bellac et al. ....... B32B 27/36
(Continued)

FOREIGN PATENT DOCUMENTS

| JP | 2000-70709 | 3/2000 | .............. B01J 21/06 |
| WO | 2005/089960 A1 | 9/2005 | .............. B05D 7/24 |
| WO | 2005/110698 A2 | 11/2005 | .............. B29C 33/56 |

OTHER PUBLICATIONS

Bankovic et al. Obtention of selective membranes for water and hydrophobic liquids by plasma enhanced chemical vapor deposition on porous substrates. Materials Science and Engineering B 112 (2004) 165-170.*

(Continued)

*Primary Examiner* — David Turocy
(74) *Attorney, Agent, or Firm* — Head, Johnson & Kachigian, P.C.

(57) ABSTRACT

The invention relates to a method and apparatus for the application of a thin film coating of material onto a surface of an article which is to be exposed to aqueous conditions such as when in the sea or rivers. The invention allows for the formation of a coating which is resistant to fouling and which coating can be formed of materials which have significantly less adverse effect on the quality of the water in which the article is placed in comparison to conventional coating types.

8 Claims, 6 Drawing Sheets

(56) References Cited

U.S. PATENT DOCUMENTS

| | | | |
|---|---|---|---|
| 6,497,803 B2* | 12/2002 | Glocker et al. | 204/298.21 |
| 6,818,309 B1* | 11/2004 | Talpaert et al. | 428/432 |
| 6,942,022 B2* | 9/2005 | Blangetti et al. | 165/133 |
| 2002/0192365 A1* | 12/2002 | Kitazoe et al. | 427/162 |
| 2005/0040034 A1* | 2/2005 | Landgraf et al. | 204/192.38 |
| 2005/0183440 A1* | 8/2005 | Holtzapple et al. | 62/333 |
| 2006/0096852 A1* | 5/2006 | Breme | 204/192.1 |
| 2006/0219598 A1* | 10/2006 | Cody et al. | 208/255 |

OTHER PUBLICATIONS

Kelly et al. Magnetraon Sputtering: A review of recent developments and applications. Vacuum 56 (2000) 159-172.*

* cited by examiner

Biofilm formation normalized against Epikote.
Bars = 2xSE (95%conf. interval)

Biofilm release expressed as % removal normalised against Silastic T2. Bars = 2xSE (95% conf. interval)

| Si + O₂ + HMDSO | 32 |
| Si + O₂ | 30 |
| Si | 28 |

METHOD OF COATING A SURFACE OF AN ARTICLE AGAINST AQUATIC BIO FOULING

The invention to which this application relates is the provision of a form of coating to prevent or reduce biofouling of surfaces in aquatic environments. The surfaces in question may be typically the surface of heat exchangers, optical end-windows, filtering membranes, aquaculture systems or even ship and boat hulls, and other structures which are in regular contact with sea and freshwater water.

Biofouling is caused by the accumulation of micro-organisms, plants and animals on surfaces such as those exposed to aquatic environment. This fouling can add to the weight of the surfaces, deface and indeed damage the same. Biofouling also has other environmental implications in energy costs and liberation of greenhouse gases. If the world fleet was totally fouled it is estimated that an extra 70.6M tonnes of fossil fuel would be burned per annum, liberating >210M tonnes $CO_2$ and 5.6M tonnes $SO_2$. Source: ttp://www.limnomar.de/download/18_Hunter.pdf Traditionally, biofouling has been controlled by the application of antifouling paints that contain biocides (i.e compounds that are toxic to the organisms) in particular within the ship industry. However, environmental regulations now require that antifouling paints, which are applied to surfaces, must not cause adverse effects to the environment and therefore many of the traditional products can no longer be used. There is therefore a need for more environmentally friendly ways of deterring marine and freshwater life from attaching to and potentially damaging surfaces to be developed whilst, at the same time preventing the problems that biofouling can cause.

The most commonly used and most effective antifouling materials conventionally available for application to submerged marine structures are paints based on copper and organo-tin (TBT) but the use of the latter will be prohibited by 2008. A number of co-biocides are currently under environmental and legislative scrutiny (e.g the triazine herbicide Irgarol 1051) and restrictions on where they can be used will continue to grow, especially in Europe. For example, various directives associated with the European Union's $6^{th}$ Environmental Action Plan will establish a framework for the protection of rivers and lakes, estuaries, coastal waters and groundwater to prevent further deterioration and protect and enhance the biodiversity of these ecosystems.

While there are non-biocidal coating technologies to reduce biofouling of ship and boat hulls, there is a current shortage of environmentally-benign technologies to control biofouling in other contexts, both in marine and freshwater environments. Three relevant situations may be described.

With regard to oceanographic instrumentation it has been found after prolonged research into marine biofilm formation and methods of delaying or reducing it, that there are no known viable technologies to adequately protect the active components of sensors in most oceanographic instruments when deployed for long (several months) periods and subjected to significant fouling pressure.

Another problematic area is with respect to heat exchanger tubes and plates. The fouling of heat exchangers in desalination and power plants causes an overall decline in plant efficiency at great economic cost. For example the presence of a biofilm on transfer surfaces of heat exchangers cooled by seawater reduces the heat transfer rate by 20 to 50% and incurs a global expenditure of over $15 billions per annum to control the problem (Source: Azis P K A, Al-Tisan I, Sasikumar N (2001) Desalination 135: 69-82). The majority of current measures to control biofouling involve the use of biocides.

The use of Microfiltration and ultrafiltration (MF/UF) membranes have become widely accepted as a viable alternative to conventional drinking water production and wastewater treatment technologies. The primary limitation to the adoption of membrane filtration for these applications is the occurrence of fouling with microorganisms and organic molecules. Fouling on membranes leads to a significant decline of the permeate flux, higher energy consumption, secondary bio-contamination by cells and metabolic products and, eventually, failure to meet the regulatory standards. Frequent cleaning of the membranes can be costly and may damage the membrane materials/barrier layers, which result in reduced membrane lifetime and selectivity. Conventional solutions to combat membrane fouling involve extensive pretreatment, and frequent cleaning with (often) aggressive chemicals, which impact on the environment. Fouling is the major problem that limits the use of membrane for seawater desalination (current market size of about 1 Billion Euros/year).

In attempting to apply protective coatings to reduce the impact of biofouling significant technical problems exist. For example, heat exchangers need a very thin coating (typically below 1 μm), and which is thermally conductive to avoid thermal transfer loss.

Also, windows of, for example, oceanographic instrumentation need a transparent coating to a certain light spectrum and above a certain (relatively high) transmission coefficient while filtration membranes need a coating as thin as 20 nm to avoid clogging the filtering pores.

Consequently, in light of the problems currently experienced and the new environmental regulations there is an additional need for a new and practical solution and an aim of the present invention is to provide a means of preventing biofouling from occurring, or if it does, to promote weak adhesion of the foulants leading to their detachment.

In a first aspect of the invention there is provided a method of protecting a surface against aquatic biofouling, said method comprising the step of applying a thin film coating onto said surface to form a protective external coating thereon.

Typically the method can be used to protect against biofouling in both maritime and in river environments.

In one embodiment the coating material includes silicon.

In one embodiment the coating is applied using Plasma Assisted Chemical Vapour Deposition (PACVD).

In one embodiment the coating is applied within a vacuum or atmospheric pressure environment and one or more deposition means are provided within said environment to deposit the selected material and/or combination of materials onto the surface or surfaces of an article which is to be exposed to potential biofouling in use.

In one embodiment the coating is applied as a unitary layer. In an alternative embodiment the coating is applied as a series of layers, with successive layers having compositions and/or structures.

In one embodiment the thickness of the coating which is applied is selected with respect to the particular usage of the surface to which the coating is to be applied, the environment to which the surface is to be exposed, and/or the duration of time for which the coating is required to be effective.

In one embodiment the deposited coating is transparent and is applied to a surface to be used for optical purposes.

In one embodiment the coating is applied to the surfaces of heat exchanger tubes or plates with respect to which seawater or freshwater is used as a coolant.

In one embodiment the coating is applied to the surfaces of filtering membranes for drinking and waste water.

In one embodiment the surface to be coated is placed into a coating chamber in a controlled pressure and the coating is applied to the surface while in said chamber.

Typically, respective selected gases flow into the chamber and are broken down and at least part of the coating is formed from substances deposited from the gas.

In one embodiment an RF or pulsed DC potential is applied to the surface to be coated.

In one embodiment an electrode is operated to assist in breaking down the gases.

In one embodiment in the coating method, respective selected gases flow into the chamber, are broken down and the substances which are deposited are from the gases.

In one embodiment precursor chemical gases are used with as low a toxicity value as possible. Potentially either corrosive or toxic by-products are trapped before release of the gases into the atmosphere.

Typically the coating which is applied has low surface energy and the surface morphology is suited to resist attachment of the fouling agents.

In a further aspect of the invention there is provided an article with at least one surface which is to be exposed to aquatic conditions and wherein said at least one surface has a coating applied thereto to form an external surface thereof, said coating formed in accordance with the method as herein described.

In a further aspect of the invention there is provided apparatus for applying material to form a coating on at least one surface of an article, which surface is to be exposed to aquatic conditions and wherein said apparatus is a closed field deposition system and for at least part of the duration of the application of the coating, material is simultaneously applied from a target of material and from at least one gas in a coating chamber in which the article is placed.

In one embodiment the apparatus is provided with means to allow physical vapour deposition of material from the target and plasma assisted chemical vapour deposition from the at least one gas.

Specific embodiments of the invention are now described with reference to the accompanying drawings, wherein.

Figure 1:
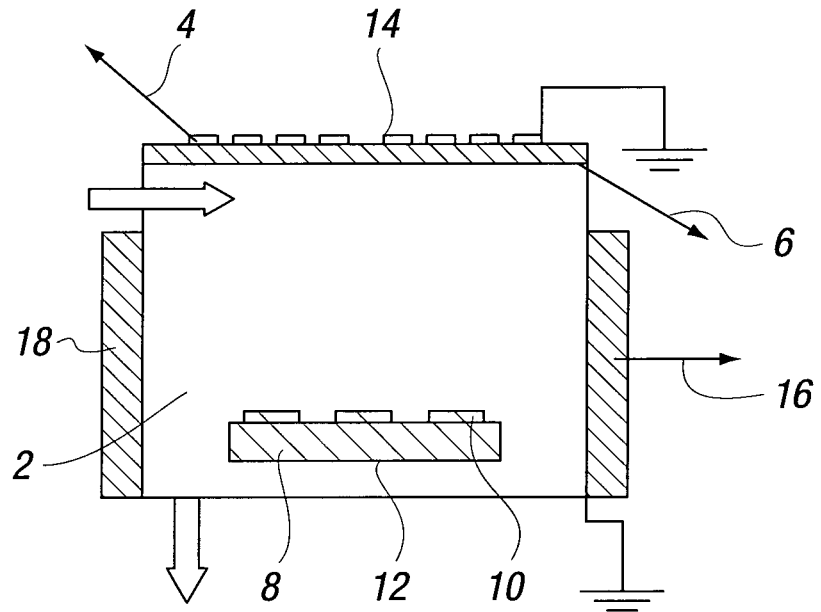
FIG. 1 illustrates a PACVD chamber in one embodiment.

One embodiment of the deposition technique is shown in FIG. 1, but it should be appreciated that the same principles (plasma polymerisation/CVD technique) can be used at different pressures (from vacuum to atmospheric pressure), and in different configurations in terms of the type of electrode and bias, research system, in-line system, etc.

In one embodiment the equipment used is a chamber 2 in which is created plasma chemistry (PACVD—Plasma Assisted Chemical Vapour Deposition.) On top of the chamber sits an RF antenna 4 on a quartz plate 6. An electrode 8 receives the substrate 10 with surfaces to be coated and is RF or/pulsed DC-biased via RF or/pulsed DC supply 12. The RF power supplies are matched at 13.56 MHz.

The magnetron arrangement 16, 18 helps to increase the plasma density in the chamber.

SiOx-like coatings were applied by PACVD using, for example, SiH4+Oxygen.

By using a precursor named Hexadimethylsiloxane or HMDSO, it is possible to modify easily the contact angle and surface energy.

The deposited coatings and studies on their resistance to fouling organisms [Prof. J A Callow and team (University of Birmingham), Dr. Qi Zhao and team (University of Dundee), Dr P Willemsen and team (TNO)] have shown that the contact angle and surface energy can influence the adhesion strength of the green seaweed Ulva, the settlement and adhesion strength of freshwater bacteria, and the adhesion strength of marine bacteria[1].

The plasma polymerisation of this precursor gives a good SiOx coating close to SiO2 but also a very hydrophobic SiOx-like (x<2) coating and as a result the plasma parameters (pressure, power and ratio monomer/(oxygen+argon)) have been controlled to form a preferred water contact angle and surface energy of this SiOx-like coating.

Figure 2:
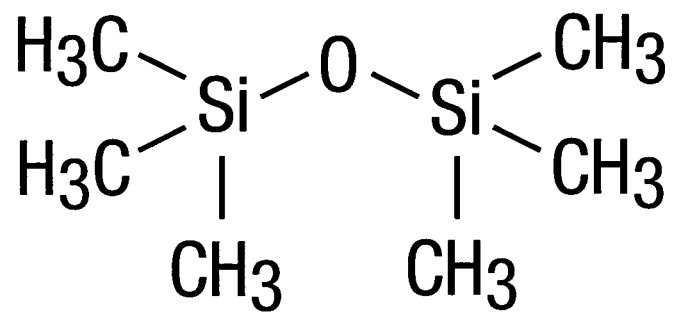
FIG. 2 illustrates a HMDSO molecule.

The monomer used for this set of samples is the Hexadimethylsiloxane or HMDSO: $[(CH_3)_3Si]_2O$ as shown in FIG. 2.

In this case the HMDSO was decomposed in Oxygen and Argon plasma.

All the "unused" CHx groups coming from the decomposition of the monomer are transformed into $CO_2$, $CO$, $H_2O$, $H_2$ compounds.

As a function of the ratios of the gases used in the coating chamber and hence the process, a SiOxCyHz coating was developed with controlled CyHz/SiOx content.

Figure 3:
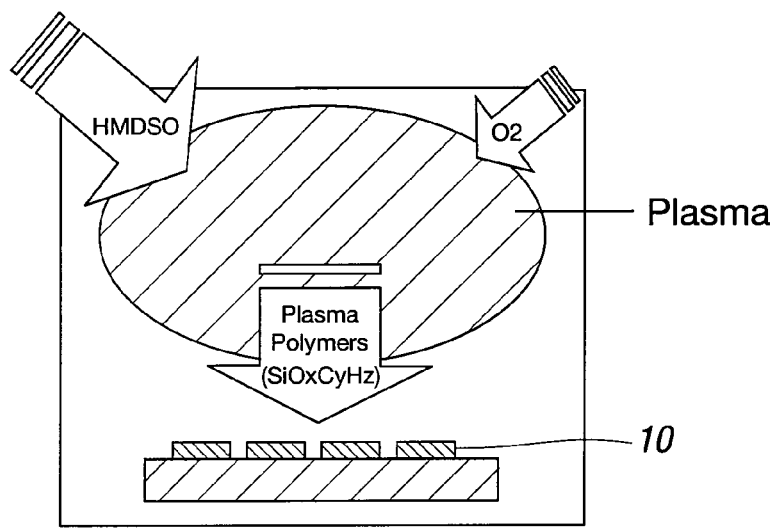
FIG. 3 illustrates a plasma chamber in accordance with one embodiment of the invention.
Figure 4:
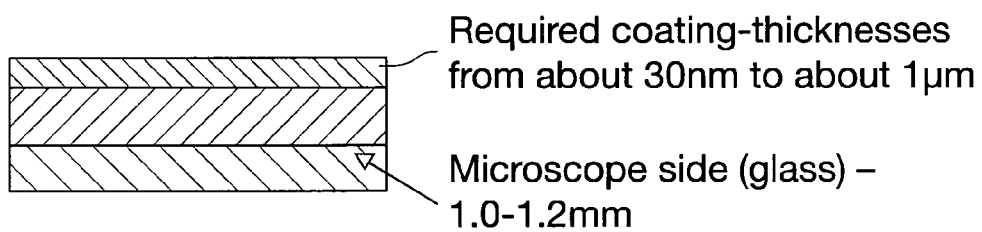
FIG. 4 illustrates a coating in accordance with one embodiment of the invention.

FIG. 3 illustrates a schematic view of the process within the chamber in which Plasma polymers SiOxCyHz were applied onto the substrates 10 to create a coating of the type shown in FIG. 4.

The preferred thickness of the coating in FIG. 4 is between 20 nm to 2 μm.

Tests of the Coatings Achieved were Performed as Follows

The tested chemistries also named "TCL40 series" can be described as follows:

| Code | Description | Relative CyHz content |
|---|---|---|
| TCL 40 − 1 | All SiOxCyHz chemistries. The level of CyHz varies consistently across the series as described in the adjacent column. All samples were transparent. | <40 |
| TCL 40 | | — |
| TCL 40 + 1 | | >40 |
| TCL 40 + 2 | | >>40 |
| TCL 40a | | >>>40 |
| TCL 40a + 1 | | >40a |
| TCL 40b | | >>40a |
| TCL 40b + 1 | | =40b but higher deposition temperature Tb + 1 > Tb |
| TCL 40bt | | =40b, Tbt >> Tb |
| TCL 40bt + 1 | | =40bt, Tbt + 1 >>> Tb |

Figure 5:
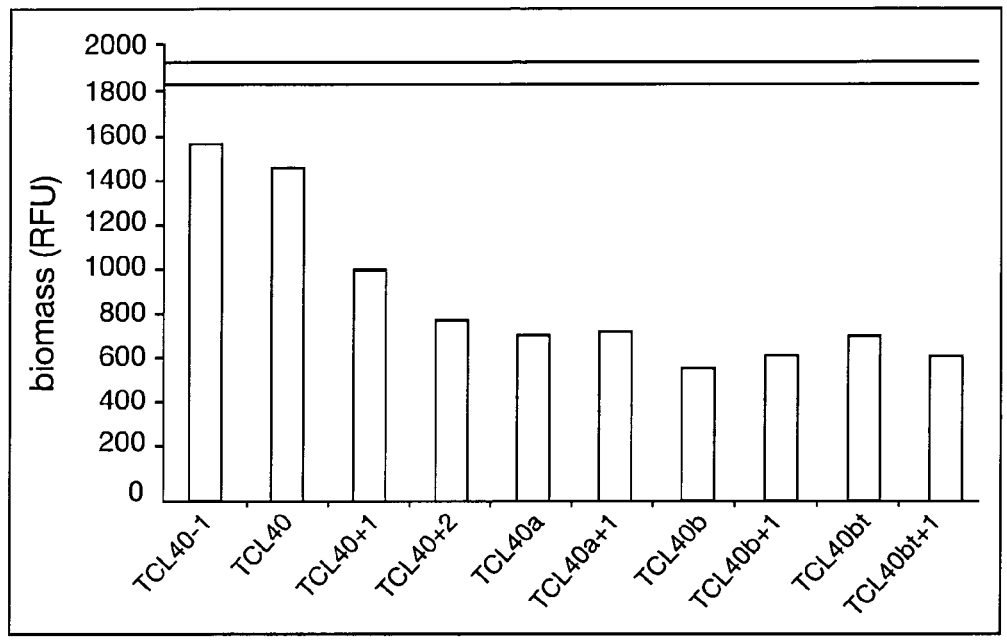
FIGS. 5 to 9b illustrate test results.

The University of Birmingham (UK), carried out biological evaluations on test samples using the green seaweed Ulva. The assays involve an estimation of the 'fouling-release' performance of biomass in the form of young plants of Ulva that were allowed to colonise the test surfaces. This was measured by exposing the test surface to a known shear force produced by a water jet apparatus (Source: Schultz M P, Finlay J A, Callow M E and Callow J A (2000) A turbulent channel flow apparatus for the determination of the adhesion strength of microfouling organisms. *Biofouling*, 15, 243-251). The proportion of the Biomass removed under shear was then calculated as a percentage of that originally present before exposure to the shear forces. This is then compared with the percentage of removal from a standard test surface known to have 'fouling release' properties (a commonly used silicone elastomer (T2 Silastic) was used). FIG. 5 illustrates a typical set of results from this assay, it can be seen that specific formulations of the invention (TCL40bt, TCL40bt+1) show a performance exceeding that of the standard T2 Silastic, indicating a good fouling-release performance.

Figure 6:
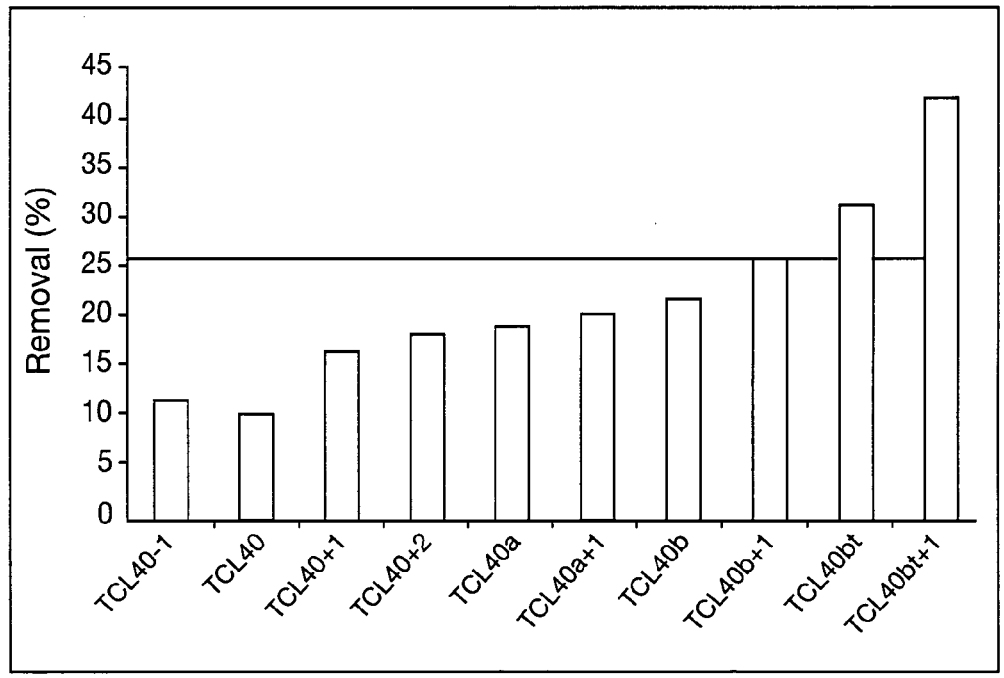
Figure 7:
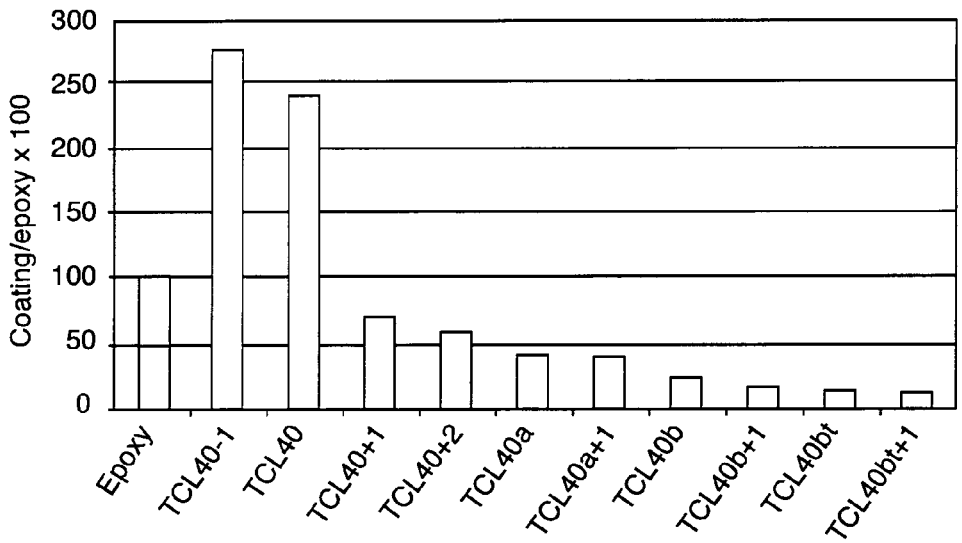
Figure 8:
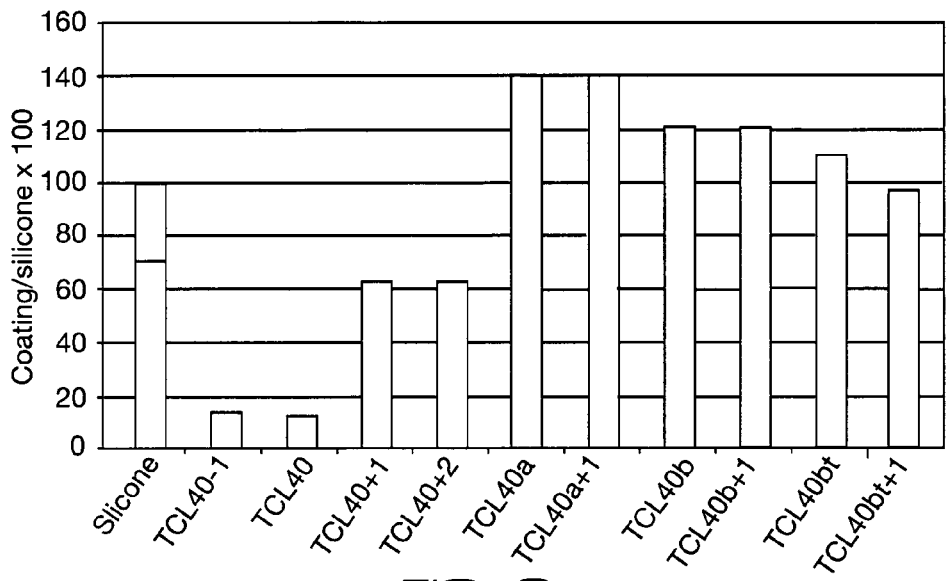

Regarding the evaluations carried on the attachment and detachment of biofilms formed from the freshwater bacterium *Pseudomonas fluorescens* at the University of Dundee, specific formulations of the invention showed very low biofilm formation (i.e. attachment and subsequent growth) of the bacterium compared to the test standard, which in this case is an epoxy resin surface (FIG. 6). Furthermore, those formulations that showed low biofilm formation also showed high levels of biofilm detachment (release of attached bacteria) (FIG. 7) compared with the detachment standard T2 Silastic.

Figure 9A:
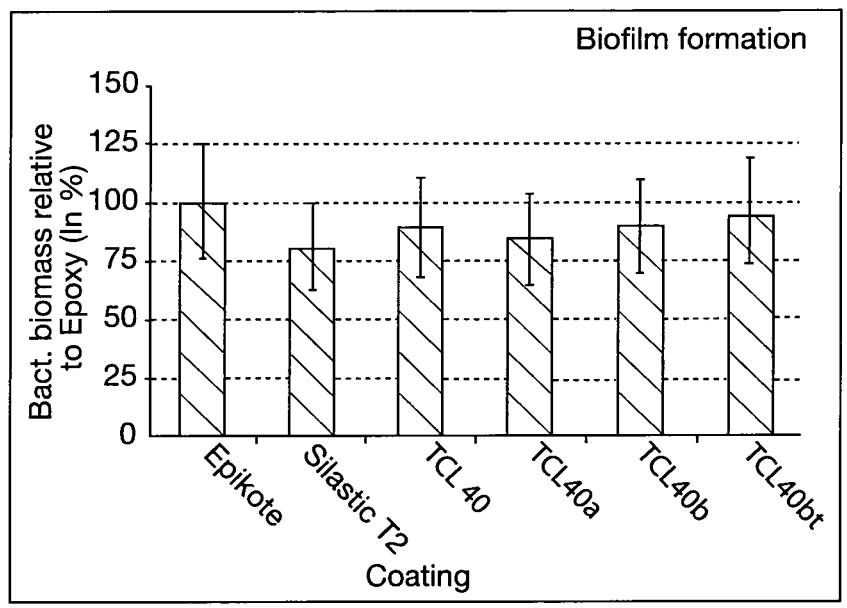
Figure 9B:
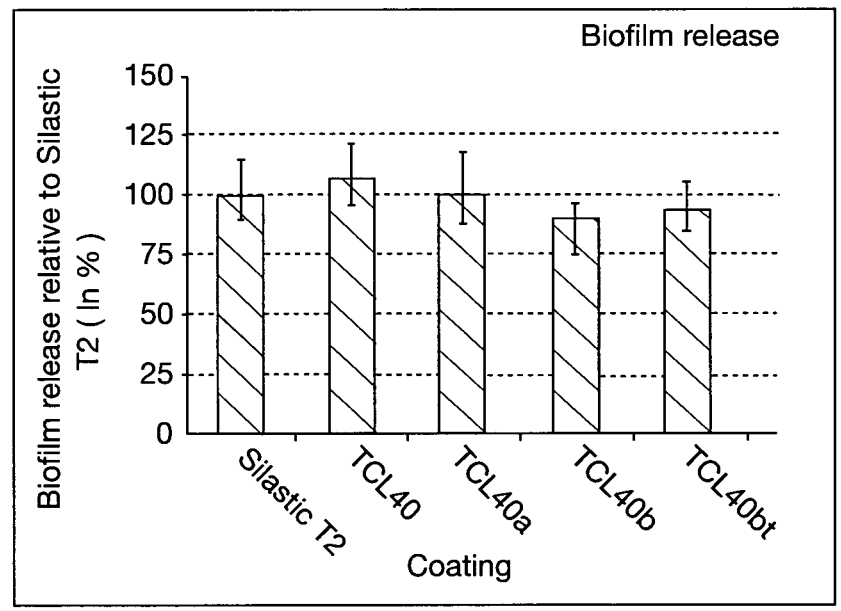

Results for marine bacteria (carried out by TNO) show that detachment of biofilms of marine bacteria from all coatings in the TCL40 series are very similar to the T2 Silastic standard for fouling-release performance (FIGS. 9a and b).

Figures 10, 11:
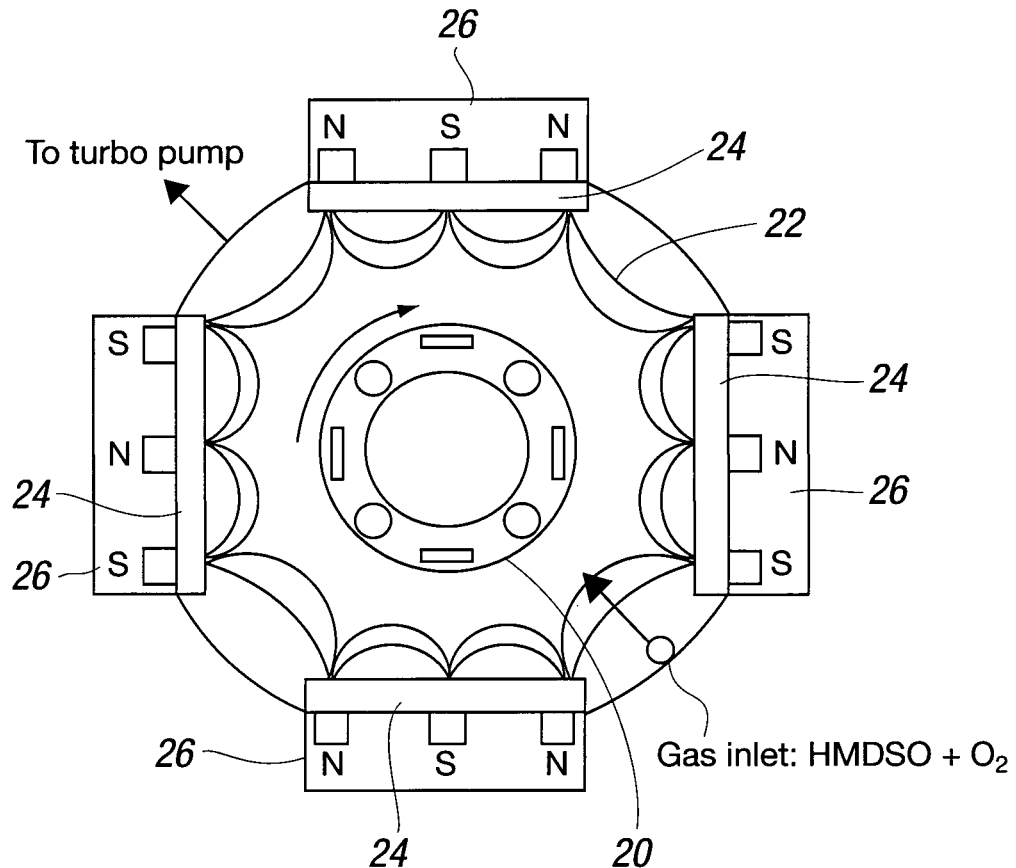
FIG. 10 illustrates a coating chamber of a type which can be used to apply the coating in accordance with one embodiment of the invention.
FIG. 11 illustrates the formation of a coating in accordance with one embodiment of the invention.

FIG. 10 illustrates a controlled environment in the form of a plasma chamber which can be used to apply the coating to the surface of an article in accordance with one embodiment of the invention.

In this example the article 20 with the surface to be coated is placed in a holder which rotates in the chamber 22 and is RF or pulsed-DC biased. Preferably the chamber and apparatus provided is in the form of a closed field system by, in this embodiment, utilising four magnetrons with magnet polarities which act to retain a strong plasma within the coating chamber.

The material from the target, 24, e.g. silicon, is deposited using the closed-field unbalanced magnetron sputtering method and with which magnetron 26 the target is located. At the same time, the plasma within the chamber assists in the dissociation of the gases, e.g. HMDO+oxygen in the chamber. Thus in this embodiment the material is deposited from both the solid target 24 and the gases simultaneously onto the sample.

One form of the coating is shown in FIG. 11 in which the same is shown in cross section. In this case the coating is multi layered coating in which the initial layer 28 which is applied to the surface of the article is Silicon in which case only material from the target 24 is deposited. Subsequent to that layer 30 is applied and formed of Si+$O_2$. The final and external layer 32 of the coating is formed of Si+$O_2$+HMDSO with the same being applied by the simultaneous deposition of material from the target and the gases within the chamber.

A range of surface energies can be obtained by varying the HMDSO/$O_2$ ratio in the external layer 32 of the coating which corresponds to the change in the hydrocarbon content of the coating.

Examples of coatings which can be deposited in accordance with the invention are shown below:

| Code | Base layer | Si target current | $O_2$ flow (sccm) | HMDSO flow (arb.) | Coating thickness (μm) | Surface energy |
|---|---|---|---|---|---|---|
| A | Si + $SiO_2$ | 3 A | 35 | 0.02 | 0.30 | <$SiO_2$ |
| B | Si + $SiO_2$ | 3 A | 30 | 0.03 | 0.20 | <A |
| C | Si + $SiO_2$ | 3 A | 25 | 0.04 | 0.50 | <B |
| D | Si + $SiO_2$ | 3 A | 20 | 0.05 | 0.50 | <C |

There is therefore provided in accordance with the invention a method and coating for reducing the effects and occurrence of biofouling without the use of biocides and thereby protecting surfaces against the effect of bio fouling.

The invention claimed is:

1. A method of protecting a surface of an article against aquatic biofouling, said method comprising:
   placing the article on a holder for rotation in a chamber while applying a thin film coating within said chamber onto said surface to form a protective external coating thereon;
   wherein said method comprises the steps of rotating the holder with the article placed thereon;
   applying a bias to the said article, applying a layer of silicon material on said surface from a solid target of silicon material;
   applying a layer of $SiO_2$ on top of the silicon material layer and then
   applying, simultaneously, material from the solid silicon target of material and material from gases in the form of HMDSO and $O_2$ introduced into the said chamber, to form the final and external layer of the said coating and the silicon material is deposited from the solid target using closed field unbalanced magnetron sputtering and operating an electrode in the chamber to assist in the breaking down of gases as the said final and external layer of the coating is formed.

2. A method according to claim 1 wherein the coating is applied using Plasma Assisted Chemical Vapour Deposition (PACVD).

3. A method according to claim 1 wherein the deposited coating is transparent and is applied to a surface to be used for optical purposes.

4. A method according to claim 1 wherein the coating is applied to the surface of a heat exchanger tube or plate with respect to which water is used as a coolant.

5. A method according to claim 1 wherein the coating is applied to the surface of a filtering membrane for water.

6. A method according to claim 1 wherein corrosive and/or toxic by-products are trapped before release of the gases into the atmosphere.

7. A method according to claim 1 wherein the morphology of the surface of the coating is formed so as to resist attachment of fouling agents to the same.

8. An article comprising:
   at least one surface which is to be exposed to aquatic conditions and wherein said at least one surface has a coating applied thereto to form an external face thereof, said coating formed in accordance with the method as herein described with reference claim 1.

* * * * *